(12) United States Patent
Meijier et al.

(10) Patent No.: US 8,159,855 B2
(45) Date of Patent: Apr. 17, 2012

(54) SWITCHABLE ELEMENT

(75) Inventors: Gerhard Ingmar Meijier, Zurich (CH); Siegfried F Karg, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 259 days.

(21) Appl. No.: 12/696,227

(22) Filed: Jan. 29, 2010

(65) Prior Publication Data
US 2010/0195381 A1 Aug. 5, 2010

(30) Foreign Application Priority Data
Jan. 30, 2009 (EP) .................................. 09151813

(51) Int. Cl.
*G11C 11/22* (2006.01)
(52) U.S. Cl. ........................................ 365/145; 365/158
(58) Field of Classification Search .................. 365/145, 365/158
See application file for complete search history.

(56) References Cited

U.S. PATENT DOCUMENTS
6,873,545 B2 * 3/2005 Johnson .................... 365/158
7,212,433 B2 * 5/2007 Johnson .................... 365/158

OTHER PUBLICATIONS

W. Eerenstein, et al., "Multiferroic and Magnetoelectric Materials", Dept. of Maerials Science, University of Cabridge, Nature Publishing Group, vol. 442/17, Aug. 2006.
Yoshinori Tokura, "Multiferroics as Quantum Electromagnets", www.sciencemag.org, Science, vol. 312, pp. 1481-1482, Jun. 9, 2006.
K.S. Novoselov, et al., "Room-Temperature Quantum Hall Effect in Graphene", www.sciencemag.org, Science, vol. 315, p. 1379, Mar. 9, 2007.

* cited by examiner

*Primary Examiner* — Son Dinh
(74) *Attorney, Agent, or Firm* — Vazken Alexanian

(57) ABSTRACT

A switchable element. The element includes a source electrode, a drain electrode, a conducting channel between the source electrode and the drain electrode, and a gate with multiferroic material being switchable, by application of an electrical signal to the gate, between a first switching state with a first spontaneous polarization direction and a second switching state with a second spontaneous polarization direction. The conducting channel is magnetoresistive, and a magnetic field strength at the conducting channel in the first switching state is different than a magnetic field strength in the second switching state, whereby a current-voltage characteristic of the conducting channel is dependent on the switching state of the multiferroic material.

12 Claims, 6 Drawing Sheets

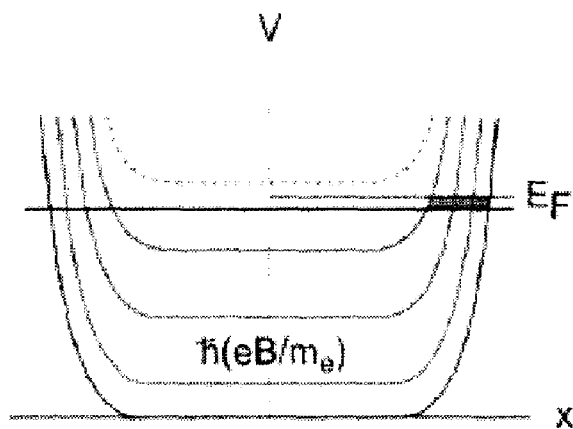
Fig. 2a
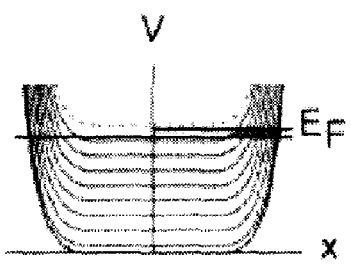 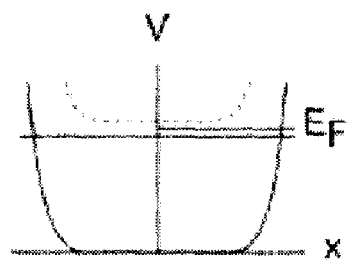
Fig. 2b                Fig. 2c

SWITCHABLE ELEMENT

CROSS REFERENCE TO RELATED APPLICATION

This application claims priority under 35 U.S.C. 119 from European Patent Application 09151813.4, filed Jan. 30, 2009, the entire contents of which are incorporated herein by reference.

BACKGROUND OF THE INVENTION

1. Field of the Invention

The present invention is in the field of switchable elements and pertains to a switchable element, and to a memory device containing a plurality of such switchable elements as memory elements or a logic circuit containing such switchable elements as switchable logic elements.

2. Description of Related Art

Memory and logic elements such as complementary metal-oxide-semiconductor (CMOS) are major classes of integrated circuits. They are used in processor and/or memory chips such as microprocessors, microcontrollers, solid-state stand-alone and embedded memory circuits and other digital logic circuits.

The most widely used memory technologies are DRAM, SRAM, Floating gate (Flash), and MRAM. None of these existing technologies can be integrated with high areal density and provide at the same time non-volatile and fast operation. Especially, Flash is too slow for many embedded applications, SRAM and DRAM loose their memory state when disconnected from the power supply, and SRAM and MRAM can only be manufactured with a limited areal density. In addition, the high programming voltage of Flash complicates integration with CMOS circuitry.

Now referring to state of the art logic elements, the logic state of CMOS is volatile and the input voltage has hence to be maintained. The always maintained input voltage will lead to considerable power consumption and heating in future CMOS generations.

SUMMARY OF THE INVENTION

In light of the above, it is desired to provide a switchable element capable of serving as memory and/or logic cell. Especially, the switchable element is desired to be non-volatile, and in addition make a high areal density and/or fast operation possible.

A switchable element according to one aspect of the present invention includes a source-drain-gate functional structure The gate includes a multiferroic material, thus a material with at least two coupled order parameters and is switchable, by application of an electrical signal, between a first switching state with a first spontaneous polarization direction and a second switching state with a second spontaneous polarization direction. A magnetorestrictive conducting channel is between the source electrode and the drain electrode. A magnetic field strength at the conducting channel in the first switching state is different than a magnetic field strength in the second switching state, whereby a current-voltage characteristic of the conducting channel is dependent on the switching state of the multiferroic material.

BRIEF DESCRIPTION OF THE DRAWINGS

In the following, embodiments of the present invention will be described referring to the accompanying drawings. The drawings are all schematic and not to scale. In the drawings, same reference numerals refer to same or corresponding elements.

FIGS. 2a-2c depict Landau energy levels in a 2D charge carrier gas for different magnetic fields;

DESCRIPTION OF THE PREFERRED EMBODIMENTS

Figure 1A:
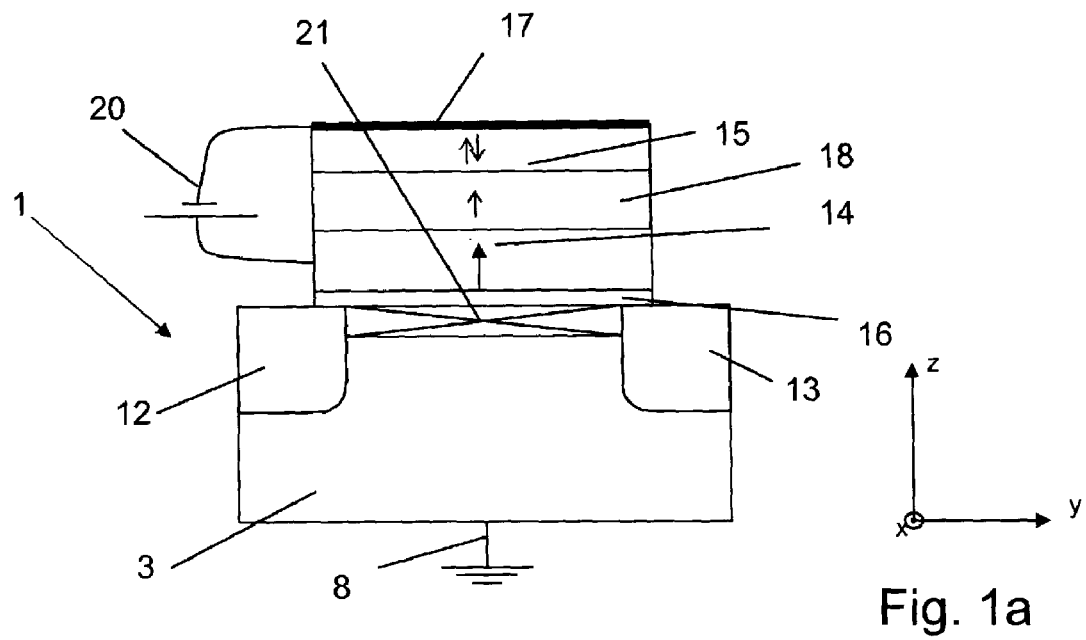
FIGS. 1a and 1b show cross sections through a first embodiment of a switchable element according to the present invention in two switching states.

Ferroelectric materials possess a spontaneous polarization that is stable and can be switched hysteretically by an applied electric field. Ferromagnetic materials possess a spontaneous magnetization that is stable and can be switched by an applied magnetic field. Multiferroic materials possess simultaneous ferroelectric and magnetic ordering. These two order parameters are coupled. There exist ferromagnetic, ferrimagnetic, and antiferromagnetic multiferroics.

The multiferroic material is therefore programmable by application of an electrical signal, for example by the application of an electric field pulse, across it. Due to the coupling of the antiferromagnetic order parameter to the ferroelectric order parameter, this causes the antiferromagnetic order parameter to be programmed, too. By this, due to the exchange coupling of the antiferromagnet to the ferromagnetic material, the magnetization direction of the ferromagnetic material is also switched.

The multiferroic material in an embodiment according to the present invention fulfills at least one of the following conditions: (i) the switching state of the multiferroic material influences the magnetization of a ferromagnet or ferrimagnet in a manner that a magnetic field strength in the conducting channel depends on the switching state of the multiferroic material; and (ii) the multiferroic material is itself ferromagnetic (or ferrimagnetic), so that a magnetic field strength in the conducting channel depends on the switching state of the multiferroic material.

The first of the two conditions is especially suitable for multiferroic antiferromagnets, that according to the current knowledge have higher ordering temperatures than their ferromagnetic counterparts.

For the switching between different field strengths, for example a further, pinned ferromagnet may be present, the stray field of which is either enhanced or at least partly compensated by the ferromagnet or ferrimagnet, depending on the switching state. Such a pinned ferromagnet may be incorporated in the gate and may form a part of it; it may even serve as gate electrode if appropriate. As an alternative, such a pinned ferromagnet may also be arranged elsewhere, for example, in a layer system forming the element, underneath the conductance channel and/or laterally thereof.

The channel region can, as is known in the art, be of an electrical conductor, semiconductor or insulating material (thus include at most comparably few free charge carriers) or be doped to be conducting. Further, it is magnetoresistive, so that an electrical resistance across the conducting channel depends on the magnetic field strength.

As an example, the conducting channel may be such that it sustains a low-dimensional (2D or 1D) charge carrier system, in which the magnetic field generates or influences a quantization effect that has an influence on the electrical conductivity. Such conductance quantization effects for example are due to the so-called quantum Hall effect in 2D-systems or due to so-called point-contact confinements in 1D systems. The quantization effect is most pronounced when inter-subband level scattering is suppressed at low temperatures but has also been observed at room temperature for appropriate material systems.

For example, in some embodiments the quantization effect may become manifest in that the derivative of the conductance to the magnetic field strength exhibits minima at a conductance $G=(2e^2/h)N$ where h is Planck's constant, e the elementary charge, and N a positive integer number The approach according to the present invention thus entails the combination of a mechanism that includes a multiferroic material and that can switch a magnetic field strength between at least two switching states (that for example may switch a magnetic field "on" and "off") with a detecting mechanism that is operable to detect, via a current-voltage-characteristic, the field strength. This is in contrast to some prior art approaches where the information bit or switching state corresponds to the magnetization direction, and it is the direction of a magnetic stray field that is read out.

According to a preferred embodiment of the present invention, a switchable element utilizes, in addition to the magnetoresistance of the conducting channel, a spin valve effect that relies on an energy barrier for the charge carriers entering the drain electrode or source electrode. Depending on the orientation of the magnetic moments, which in turn may depend on the switching state because of stray fields, the energy barrier is higher or less high. To this end, preferably the drain electrode and/or the source electrode is ferromagnetic.

The switchable element features the advantage of being non-volatile, because the ferroelectric and magnetic order parameters of the multiferroic material are non-volatile. Due to its non-volatile character, low power consumption can be expected.

Also, changing the ferroelectric polarization of a multiferroic element is an inherently fast process (50 ps). The switchable element according to the present invention therefore has a significant programming speed advantage compared to flash memory (1 µs).

Further, the switchable element can be implemented in a simple, small unit cell (having a required space of $6F^2$ only, in a 1-Transistor structure without any additional resistors or capacitors) and thus is suitable for integration with higher areal density than prior art switchable elements. Also, it scales well when going to smaller cells, because it does not include any capacitors.

Yet a further advantage of the switchable element, especially compared to MRAM, is a reduced write energy of about $10^{-15}$ J/bit versus $10^{-11}$ J/bit for MRAM.

An even further advantage of the switchable element, especially compared to Flash, is a lower programming voltage of around 1 V or a few V versus 15 V for Flash.

Possible ferromagnetic multiferroics include Boracite ($Ni_3B_7O_{13}I$), Perovskites like $BiMnO_3$ and $TbMnO_3$, and Sulfates such as $CdCr_2S_4$. In these currently known materials, however, the coupled order parameters are non-zero at low temperatures only, so that the switchable element and devices made therewith are primarily suited for special applications where cooled devices are acceptable. The skilled person will readily realize that the concept of this embodiment of the present invention is suited for broader, everyday applications of memory devices and/or logic circuits once multiferroic ferromagnetic materials become known that are stable also at room temperature and above.

According to a particularly preferred embodiment, however, the multiferroic material is a multiferroic antiferromagnet coupled, in general by exchange bias coupling, to either the switchable ferromagnet (or ferrimagnet) or to the drain (or source) electrode and pinning the same. This 'ferromagnet pinning' embodiment first features the advantage that known antiferromagnetic multiferroics have higher ordering temperatures than their ferromagnetic counterparts. Also, there is the special advantage that the superparamagnetic limit (i.e. the size at which the magnetic anisotropy of a magnetic layer in a cell becomes comparable to kT, where k is Boltzmann's constant and T is the absolute temperature, so that the magnetization becomes unstable below that limit) is not an issue in antiferromagnets, so that the cell may be designed to be comparably smaller and still be stable.

An example of a useable antiferromagnetic multiferroic material is $BiFeO_3$.

A device (memory device or logic circuit) includes means for applying a "write" voltage pulse to the gate, and includes readout means for reading out a current-voltage dependence between the source and drain electrodes, that will depend on the switching state. Further, a control of the device may if necessary apply a bias voltage to the gate during the read step, for example for ensuring that the charge carriers are confined to a layer adjacent the gate insulator, so that low-dimensional conductance behaviour is encountered. The gate voltage during the "read" process then is smaller than a write pulse voltage.

The switchable element according to the present invention can be used both, as memory cell of a memory device and as logic element of a logic circuit. If the conducting channel is semiconducting (doped or undoped), the switchable element can be used in the manner of a conventional FET as well as for example select-transistor for the read operation.

By that memory and logic circuits can be integrated without additional mask steps, which provides a considerable manufacturing cost advantage for such integrated circuits.

In the ferromagnetic materials of depicted elements in the figures filled arrows generally indicate fixed magnetizations, thus magnetizations that are pinned in some way, that have coercive field that is higher than the sum of effective fields enacting on them during normal operation or that are otherwise influenced not to change a magnetization direction during normal operation of the programming element. Open arrows indicate magnetizations that are switchable by the programming voltage pulse signals.

Figure 1B:
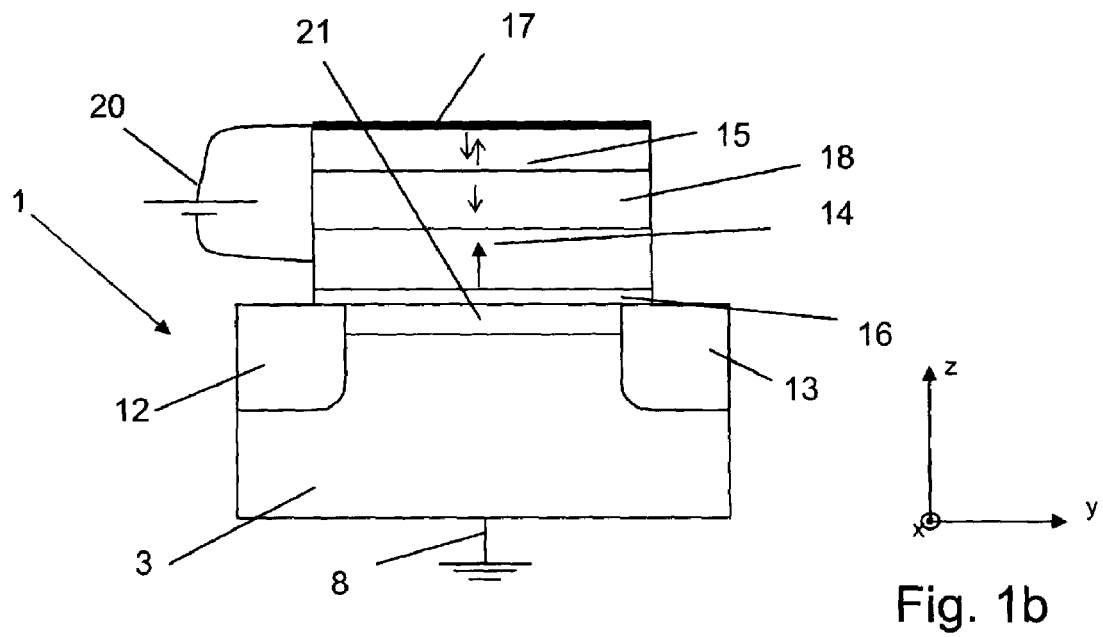

The switchable element 1 depicted in FIGS. 1*a* and 1*b* includes, on a substrate 3, a source electrode 12 and a drain electrode 13. Between the source and drain electrodes, a conducting channel 21 is formed, for example by a thin doped region in the substrate or a thin electrically conducting coating, such as a Graphene layer, or in any other suitable manner.

Especially, in the embodiment described here, the conducting channel 21 is a quantized conductance channel, where the conductance as a function of an external magnetic field shows quantized behaviour. As an alternative, it could also exhibit a different kind of a magnetoresistive effect where the electrical resistance depends on the strength of the magnetic field impinging on it. For example the conducing channel 21 may include so-called colossal-magnetoresistance materials.

The substrate may be any known or other suitable substrate, such as a semiconducting substrate, for example Gallium Arsenide or Silicon. The substrate in the depicted embodiment is contacted by a reference voltage contact, namely a ground contact 8 (or "bulk" contact). As is known in the art, there may be a (not depicted) electrical connection between for example the source electrode 12 and the ground contact 8, so that the former is always on ground potential (or an other reference potential as the case may be).

The switchable element 1 further includes a gate that includes a gate electrode 17, a pinned ferromagnetic (or ferrimagnetic) layer 14, of any ferromagnetic electrically conducting material, an antiferromagnetic multiferroic layer 15 between the gate electrode 17 and the pinned ferromagnetic layer 18, and a switchable ferromagnetic layer 18 in immediate contact with the multiferroic layer 15. The pinned ferromagnetic layer 14 is insulated by a dielectric layer 16 from the source and drain electrodes 12, 13 and from the conducting channel 21.

A programming voltage 20 may be applied between the pinned ferromagnetic layer 14 and the gate electrode 17. By this, the spontaneous polarization of the multiferroic material may be switched between a first and a second state depicted in FIGS. 1a and 1b, respectively. Because the material is multiferroic, the switching of the ferroelectric spontaneous polarization also switches the according antiferromagnetic order parameter, for example by reversing the sequence of "up" and "down" magnetized layers in the multiferroic material. The switchable ferromagnetic layer 18, being immediately adjacent to the multiferroic layer 15, is exchange coupled to the multiferroic layer. Due to this, the switching of the ferroelectric spontaneous polarization of the multiferroic layer 15 has the effect of also switching the magnetization direction of the switchable ferromagnetic layer 18.

The thickness and electronic configuration of the pinned ferromagnetic layer 14 and of the switchable ferromagnetic layer 17 may be such that their magnetizations' absolute values are approximately equal (for example, the difference is less than 40%, preferably less than 25% or less than 15% of the larger of the two magnetization values), so that the stray field produced by them approximately compensate if the magnetizations are oriented antiparallel as shown in the configuration of FIG. 1b. If, however, the magnetizations are neither fully nor approximately antiparallel (and preferably parallel as in FIG. 1a), the stray fields add to a field with a higher absolute value than the stray field of one of the layers 14, 18.

The situation with parallel magnetizations (FIG. 1a) in the following is referred to as the magnetic field B="1" (sometimes the B field is also termed 'magnetic induction') switching state, and the situation with antiparallel magnetizations is termed the B="0" switching state.

For example, the magnetic field B will cause a quantization of the energy levels in the conducting channel (in the 2D conductance case; in the 1D conductance case, strictly speaking the quantization of the energy levels is caused by the lateral confinement, and the magnetic field B will cause depopulation of the 1D levels). FIG. 2a shows the according principle. All of FIGS. 2a-2c show the potential V as a function of the position along the x-direction (see FIGS. 1a and 1b), i.e. the in-plane direction that is perpendicular to the line connecting the source electrode and the drain electrode. The magnetic field will cause a splitting of the possible energy states into Landau levels that are separated by $\Delta E = heB/(2\pi m)$, where h is Planck's constant, B the magnetic field, e the elementary charge, and m the effective mass of the charge carriers. It has been shown that in a two-dimensional charge carrier system (n-type or, p-type charge carriers), the electrical conductance G depends on the number of the levels N at the Fermi energy $E_F$ only, i.e. $G = (2e^2/h)N$ (Landauer formula). As can be seen in the FIG. 2a, the Landau levels cross the Fermi energy at the edges, i.e. conductance will take place at the edges of the device in so-called edge channels.

The number N of energy levels is now given by $N = \text{Int}[\frac{1}{2} + 2\pi E_F/(h\omega_C)] = \text{Int}[\frac{1}{2} + 2\pi E_F m/(heB)]$ (see for example C. W. J. Beenakker and H. van Houten, in Solid State Physics, edited by H. Ehrenreich and D. Turnbull (Academic, New York, 1991), Vol. 44, p. 1.), with $\omega_C$ the cyclotron frequency. "Int" denotes truncation to an integer. This means that the higher the magnetic field B the less states are present at the Fermi energy that may contribute to conduction. If the magnetic field B is large enough to lead to $2\pi E_F m/(heB) < \frac{1}{2}$, the above equation will lead to zero states at the Fermi energy, i.e. there will be no conduction at all.

In practice, the two-dimensionality of the charge carrier gas may be ensured by the physical structure of the conducing channel (conductance can be in a thin layer only, with a barrier in the z-direction), and/or by an electric field applied to the gate. In the embodiments described referring to FIG. 3a and the following hereinafter, the voltage used for this should be engineered to be smaller than a "write" pulse voltage so that the "read" process does not itself influence the switching state.

The difference between B="0" and B="1" for the two-dimensional case is schematically illustrated in FIGS. 2b and 2c for the case where B="1" refers to a case where the field is high enough to satisfy the above-mentioned condition $2\pi E_F m/(heB) < \frac{1}{2}$. In the B="0" situation (FIG. 2b), the conductance will be $G = (2e^2/h)N$ with N a large number, and for B="1", $G = (2e^2/h)N = 0$, i.e. the quantized conductance channel is essentially closed.

This is illustrated in FIG. 1a by a crossed quantized conductance channel.

In practice, the principle will also lead to a suitable switching element (especially if used as memory element) if the quantized conductance channel will not exhibit zero or almost zero conductance in one of the switching states but only a significantly smaller conductance than in the respective other switching state.

A numerical estimate: for a realistic magnetic field of B=1T, the condition $2\pi E_F m/(heB) < \frac{1}{2}$ in a two-dimensional charge carrier gas is fulfilled for $n_S = 2*10^{10}$ cm$^{-2}$, where $n_S$ is the areal charge carrier density, i.e. the number of charge carriers per unit area. A significant effect can be expected to arise also if the charge carrier density is up to 10-20 times higher. Given the fact that magnetic fields of more than 1 T may be feasible, in some embodiments a maximum charge carrier areal density in the conducting channel of $10^{12}$ cm$^{-2}$ may be desired; the charge carrier areal density may be engineered by appropriate doping and the confinement, as is known in the art.

The switching element according to the present invention may both, be incorporated in devices (circuits, memories) operating at low temperatures (for example the temperature of liquid nitrogen or lower), and in devices operating at room temperature or above.

For room temperature operation, in order to avoid too strong smearing out of the above-described quantization effect, it may be desirable to also ensure that the inter-Landau level scattering is suppressed, i.e. to ensure that the Landau levels do not overlap too much due to thermal broadening. From this, a second possible conditions valid for some embodiments results: If, again at B=1T, the energy separation of Landau levels $heB/(2\pi m)$ is to be larger than kT (k=Botzmann's constant, T=the absolute temperature), then the effective mass m should be smaller than 0.004 $m_e$, where $m_e$ is the electron mass. This is a feasible value, and for example in Graphene, that exhibits a theoretical effective mass of 0 at the Fermi energy, quantum Hall effects have indeed been observed at room temperature, with observed effective masses below the above-discussed value.

In reality, this condition does not have to be fulfilled precisely, since again it is sufficient that there is a significant effect. In some embodiments, however, preferably the condition that $m<0.02*m_e$, especially preferred $m<0.01*m_e$ should be fulfilled, depending on, among other parameter, the operation temperature and on whether or not in the B="1" state the lowest Landau level is above the Fermi energy and how far.

While the above-discussed effect relates to a 2D charge carrier gas, also a channel including a 1D point-contact or conducting channel including a plurality of 1D sub-channels could be used for implementing the present invention. The physical realization of a 1D channel could for example be based on the already-discussed FinFET or Tri-Gate transistors, but with the gate wrapped around the conducting channel. If the conducting channel in such an architecture has a small enough thickness, it forms a quantum wire. In such a 1D conductor system, due to the confinement, energy levels are formed, with the k-vector components in directions perpendicular to the wire direction spaced by $\pi/W$, with W the width of the lateral confinement. Thus, at 0 magnetic field the number of occupied subbands is $N=\text{Int}[k_F W/\pi]$. The conductance is then, in accordance with Lanauer's formula $G=(2e^2/h)N$.

When additionally a magnetic field B is applied, the field B determines the number of the occupied subbands together with the confinement. For large magnetic fields B (the effect of the magnetic field dominates the effect of the confinement), the number of subbands at the Fermi energy is again given by $N=\text{Int}[\frac{1}{2}+2\pi E_F/(\hbar\omega_C)]=\text{Int}[\frac{1}{2}+2\pi E_F m/(\hbar eB)]$ (see for example B. J. van Wees et al., Phys. Rev. B, 38, p. 3625 (1988)). The above considerations for a 2D carrier gas, therefore, also hold for the 1D case.

Figure 3A:
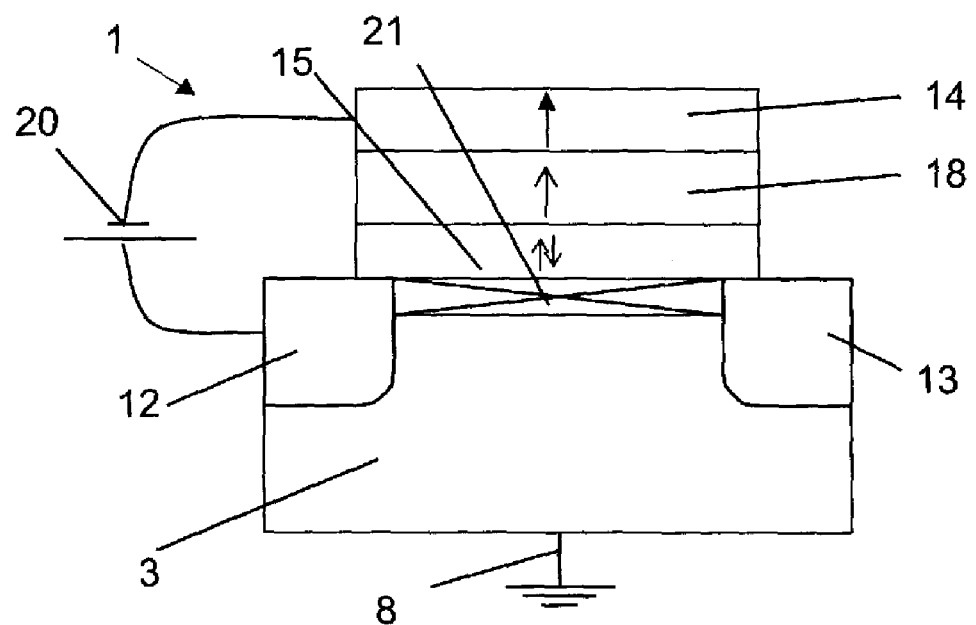
FIGS. 3a and 3b show cross sections through a second embodiment of a switchable element according to the present invention in two switching states.
Figure 3B:
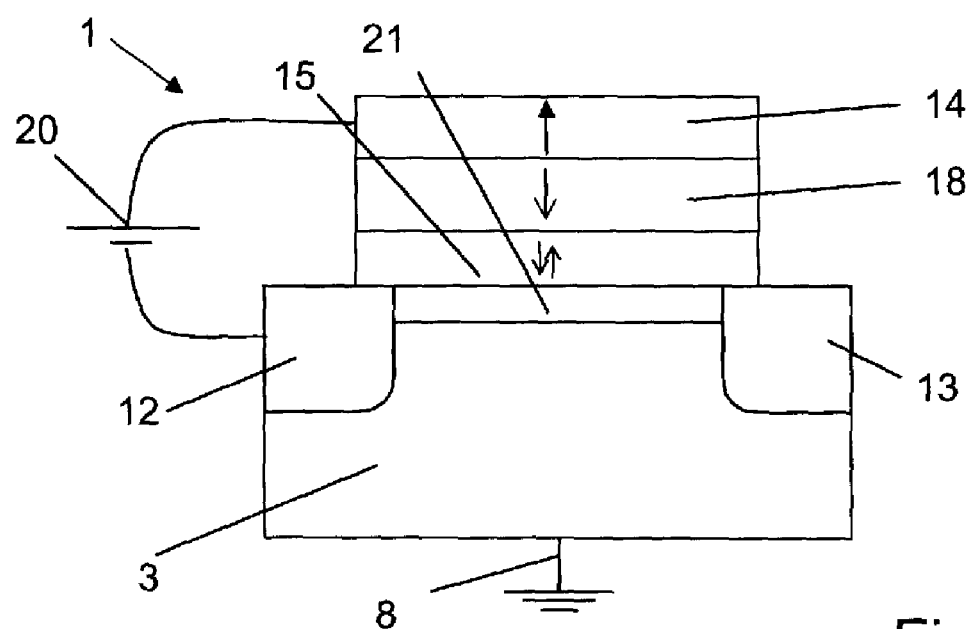

The switchable element 1 design of FIGS. 3a and 3b (showing, in analogy to FIGS. 1a and 1b, the closed and open states, respectively) is different from the one of FIGS. 1a and 1b in that the sequence of the multiferroic layer 15, of the switchable ferromagnetic layer 18, and of the pinned ferromagnetic layer 14 is reversed. The multiferroic layer 15 is sandwiched between the switchable ferromagnetic layer 18 on one side and the conducting channel 21 and the source and drain electrodes on the other side. The dielectric layer 16 then is not necessary any more, because the multiferroic material 15, in contrast to most of the commonly used ferromagnetic materials, is electrically insulating.

Also, a separate gate electrode layer 17 is optional and not shown in the drawings, since the pinned ferromagnetic layer 14 itself can optionally serve as the gate electrode.

In the configuration of FIGS. 2a and 2b, the programming voltage 20 may be applied between the gate electrode (ferromagnetic layer 14) and the source electrode 12 or the drain electrode 13. In contrast to FIGS. 1a and 1b, no separate contact (fifth contact, if the 'bulk' electrode is also counted) for the pinned or switchable ferromagnetic layer is needed. The stray magnetic field produced by the ferromagnetic layers 14, 18 impinges on the charge carriers flowing in the conducting channel 21 through the multiferroic material 15 instead of through the dielectric material 16.

Apart from this difference, the functioning principle is analogous to the one of FIGS. 1a and 1b.

Figure 4A:
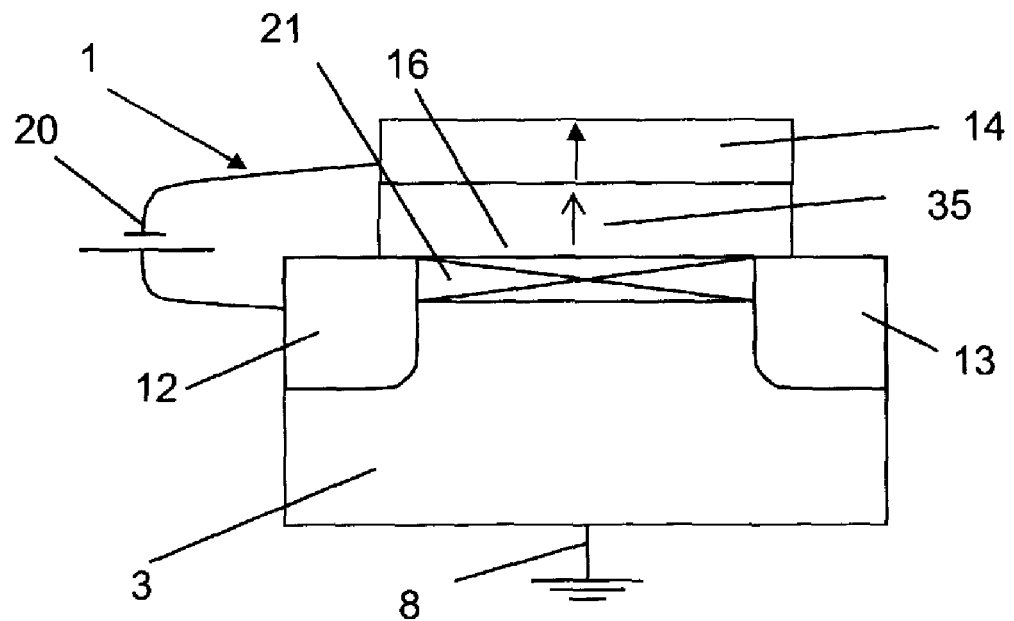
FIGS. 4a and 4b show cross sections through a third embodiment of a switchable element according to the present invention in two switching states.
Figure 4B:
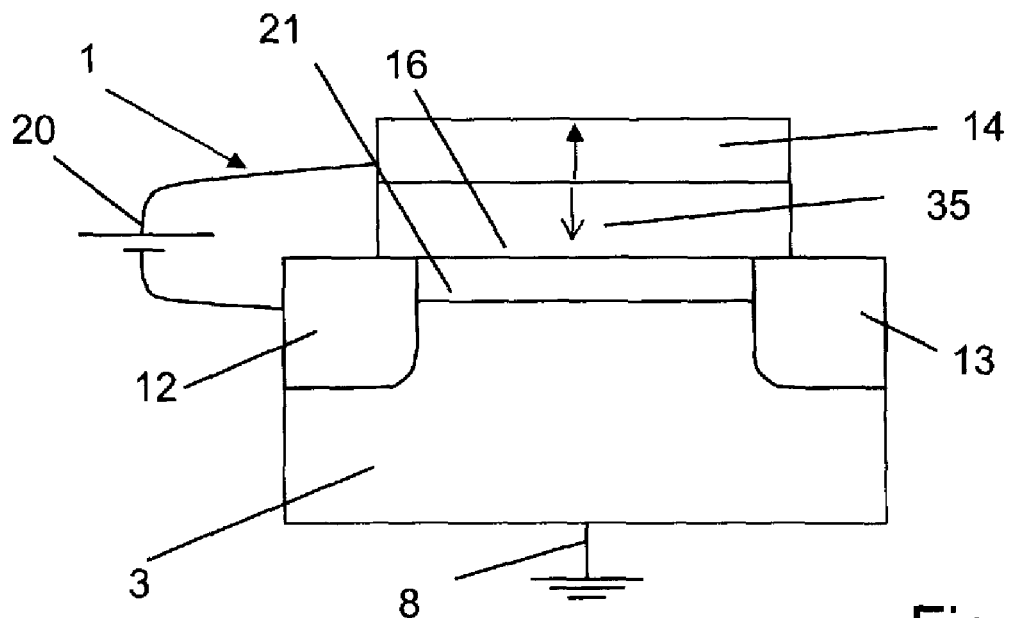

The principle described referring to FIGS. 1a/1b and 3a/3b may also be realized with a ferromagnetic multiferroic material instead of a separate switchable ferromagnetic layer exchange coupled to a multiferroic antiferromagnet. Such configuration is depicted in FIGS. 4a and 4b. The multiferroic ferromagnet 35 in the closed (B="1"; FIG. 4a) state has a magnetization essentially parallel to the magnetization of the pinned ferromagnet, 14, whereas its magnetization is antiparallel in the open (B="0"; FIG. 4b) state.

Figure 5A:
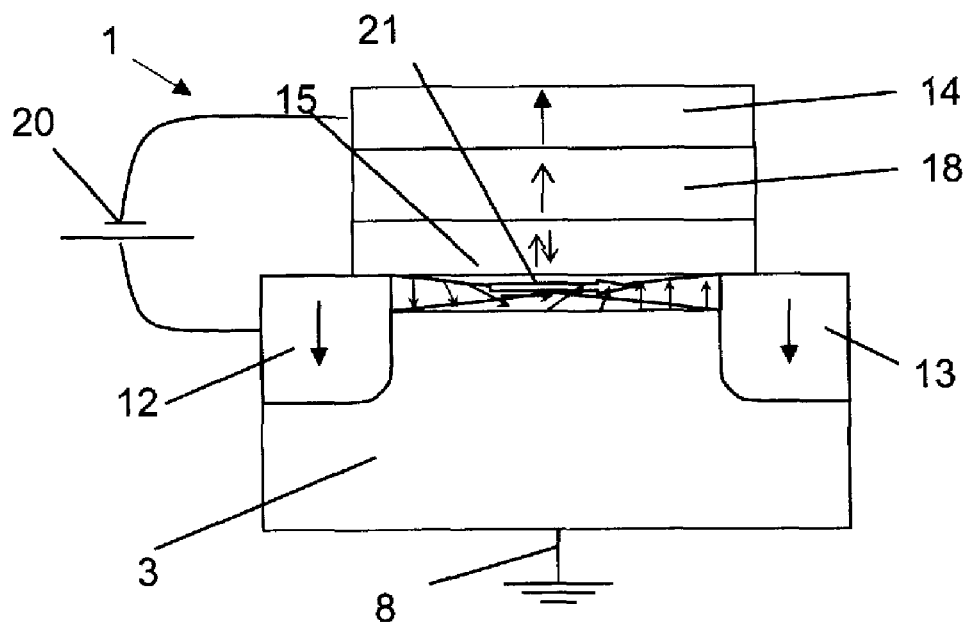
FIGS. 5a and 5b show cross sections through a fourth embodiment of a switchable element according to the present invention in two switching states.
Figure 5B:
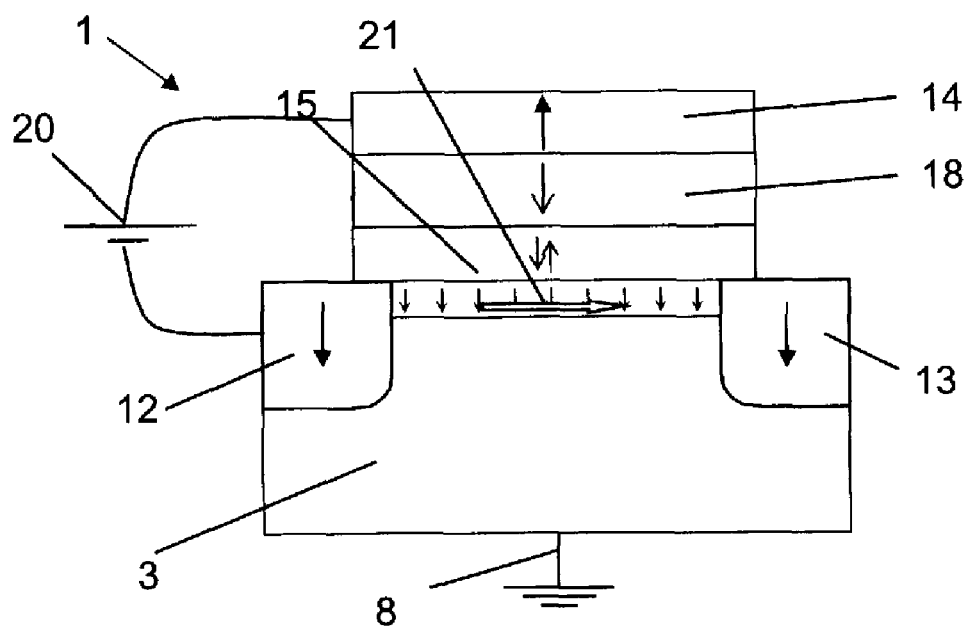

The leakage current in the "closed" state—to be excepted in reality—can be further reduced when the conductance channel is incorporated in a spin valve like arrangement with a ferromagnetic detector and possibly also a ferromagnetic injector. Such an additional measure can be applied to all above-mentioned configurations. FIGS. 5a and 5b show it for the configuration as shown in FIGS. 3a and 3b. Both, the source electrode 12 and the drain electrode 13 are of a ferromagnetic electrically conducting material, for example of a Cobalt alloy or of Permalloy (an FeNiCo alloy). The magnetization is pinned and in the depicted embodiment is equal for both electrodes. The magnetization further is antiparallel with respect to magnetization of the pinned layer 14.

In the "closed" state, the magnetic field produced by the joint action of the pinned ferromagnetic layer 14 and the switchable ferromagnetic layer 18 will cause the magnetic moments of the charge carriers (symbolized by small arrows in the conducting channel 21) to flip, during their transitions through the conducting channel, from an initial orientation parallel to the injecting (source) electrode 12 to an orientation parallel to the field B and therefore antiparallel to the magnetization of the receiving (drain) electrode 13. Therefore, the charge carriers encounter a higher energy barrier when entering the receiving electrode than if the magnetization would be oriented parallel to the magnetic moments. This will lead to an additionally higher electrical resistance than in the case where the magnetic moments are parallel (FIG. 5b, "open" state").

Two further variants of the embodiment of FIGS. 5a and 5b are possible:

As a first variant, the injector (for example the source electrode) need not be ferromagnetic and will inject unpolarized charge carriers. In the closed state, the charge carriers will be polarized and encounter the energy barrier as in the above embodiment. In the open state, the charge carriers will remain unpolarized if the magnetic field is more or less exactly equal to 0.

In a second variant the electronic configuration of the ferromagnetic drain electrode (and possibly also the source electrode) is different. Namely, for a certain band structure of the drain electrode material, the larger energy barrier is encountered for magnetic moments that are parallel to the magnetization. This can be true for example if the drain electrode material includes a so-called 'strong' ferromagnet where there are no free states for charge carriers in the majority band. In such a variant, therefore, the magnetization of the drain electrode will preferably be parallel to the magnetization of the pinned ferromagnetic layer.

More generally, further embodiments of the present invention include embodiments that do not include the pinned ferromagnetic layer. Instead it is also possible to provide just the switchable ferromagnet, and to provide for a demagnetization to obtain the "open" switching state.

Figure 6A:
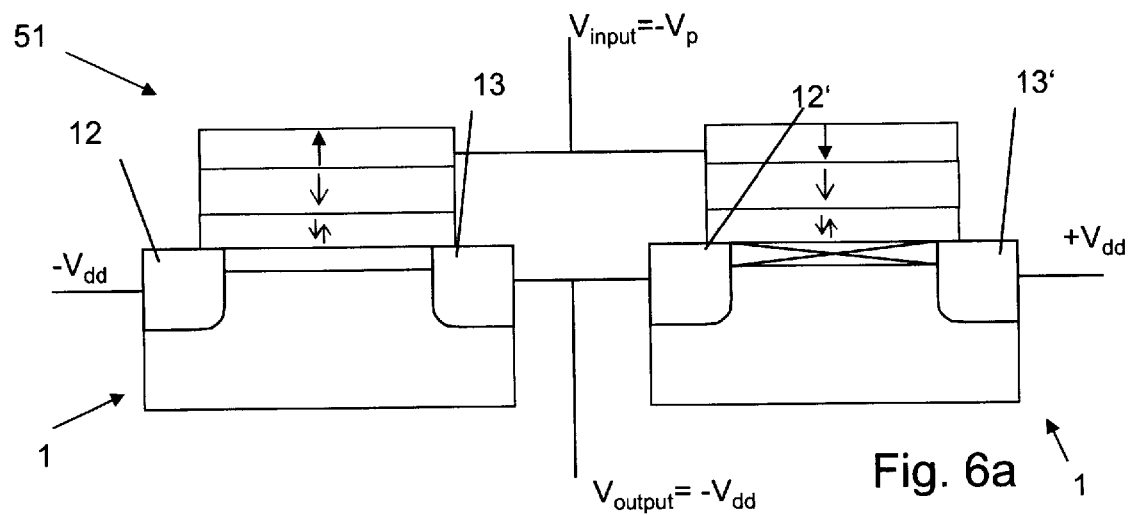
FIGS. 6a and 6b show cross sections through a logic element including two switchable elements according to the present invention in two switching states.
Figure 6B:
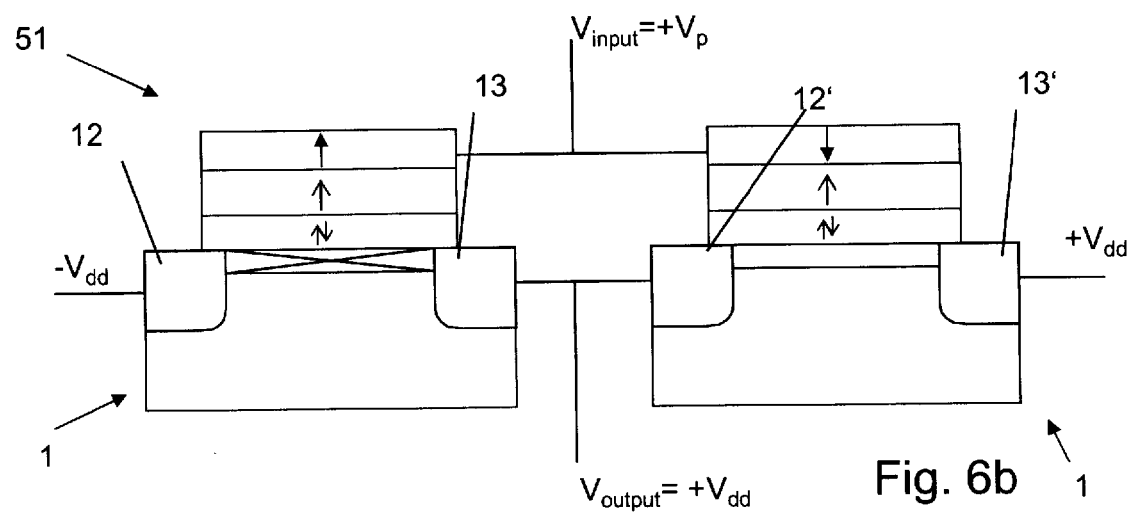

As depicted in FIGS. 6a and 6b, a logic element 51 similar to a CMOS inverter can be formed combining two switchable elements 1, 1' according to the present invention. For reasons of simplicity, it is assumed that the resistance in the closed state is larger than the resistance in the open state by orders of magnitude, thus "R=∞" in the closed state, and "R=0" in the open state; in physical reality this might be achieved only approximately.

In the depicted embodiment, two switchable elements as described referring to FIGS. 3a and 3b are used, however, any two specimens of an embodiment of a switchable element within the scope of the present invention, whether described in detail herein or not, may be combined to form a logic element.

The gate electrodes of the two switchable elements are connected in parallel, and the drain electrode 13 of the first switchable element is in electrical contact with the source electrode 12' of the second switchable element and with an output terminal 52. The source electrode of the first switchable element 1 is connected to a first voltage ($-V_{DD}$), and the drain electrode of the second switchable element 11 is connected to a second voltage ($+V_{DD}$).

Depending on the polarity of the input voltage, either the first voltage (FIG. 5a) or the second voltage (FIG. 5b) will be connected to an output port 52. Once the magnetization of the ferromagnetic gate layers is set by the input voltage across the multiferroic layer, the output retains its logic state even when the power supply is disconnected.

While the present invention has been described with reference to preferred embodiments thereof, those skilled in the art will recognize that the above and other changes in form and details may be made without departing from the spirit and scope of the invention as set forth in the following claims.

What is claimed its:

1. A switchable element comprising a source electrode, a drain electrode, a conducting channel between the source electrode and the drain electrode, and a gate, the gate comprising multiferroic material and being switchable, by application of an electrical signal to the gate, between a first switching state with a first spontaneous polarization direction and a second switching state with a second spontaneous polarization direction, wherein:
   the conducting channel is magnetoresistive; and
   a magnetic field strength at the conducting channel in the first switching state is different than a magnetic field strength in the second switching state, whereby a current-voltage characteristic of the conducting channel is dependent on the switching state of the multiferroic material.

2. The switchable element according to claim 1, wherein the conducting channel is a quantized conductance channel.

3. The switchable element according to claim 2, wherein the quantized conductance channel is characterized in that the derivative of the conductance to the magnetic field strength exhibits minima at $G=(2e^2/h)N$ for N being a positive integer number.

4. The switchable element according to claim 2, wherein an effective mass of the charge carriers in the conducting channel is less than or equal to $0.02*m_e$, where $m_e$ is the electron mass.

5. The switchable element according to claim 4, wherein:
   the gate comprises a fixed magnetization ferromagnet or ferrimagnet and a switchable gate ferromagnet or ferrimagnet, wherein a magnetization of the switchable gate ferromagnet or ferrimagnet depends on the switching state of the multiferroic material.

6. The switchable element according to claim 5, wherein the switchable gate ferromagnet or ferrimagnet is exchange coupled to the multiferroic material.

7. The switchable element according to claim 5, wherein the multiferroic material is a multiferroic ferromagnet or ferrimagnet and constitutes the switchable gate ferromagnet.

8. The switchable element according to claim 5, wherein:
   at least one of the drain electrode; and
   the source electrode is ferromagnetic to form a spin valve and is magnetized in a direction in which charge carriers with a magnetic moment parallel to the magnetization of the fixed magnetization ferromagnet or ferrimagnet encounter a higher energy barrier when entering the said source or drain electrode than charge carriers with a magnetic moment antiparallel to the magnetization of the fixed magnetization ferromagnet or ferrimagnet.

9. The switchable element according to claim 8, comprising contacts for applying the electrical signal between a gate contact and one of the source electrode, the drain electrode, and a bulk contact.

10. A logic element comprising:
    a first switchable element; and
    a second switchable element according to claim 5 wherein the fixed magnetization direction of the fixed magnetization gate ferromagnet or ferrimagnet of the first switchable element and the fixed magnetization gate ferromagnet or ferrimagnet of the second switchable element differs, the drain electrode of the first switchable element and the source electrode of the second drain electrode being electrically connected, whereby the electrical signal can simultaneously be applied to the gate of the first and of the second switchable element.

11. A logic circuit comprising:
    a plurality of switchable elements; and
    at least one logic element comprising:
       a first switchable element; and
       a second switchable element according to claim 5, wherein the fixed magnetization direction of the fixed magnetization gate ferromagnet or ferrimagnet of the first switchable element and the fixed magnetization gate ferromagnet or ferrimagnet of the second switchable element differs, the drain electrode of the first switchable element and the source electrode of the second drain electrode being electrically connected, whereby the electrical signal can simultaneously be applied to the gate of the first and of the second switchable element.

12. A memory device comprising:
    a plurality of switchable elements according to claim 1 serving as memory cells; and
    contacts for applying electrical signals individually to the gates of the switchable elements and contacts for reading out by determining an electrical resistance between the source and the drain electrode of an individually addressed switchable element.

* * * * *